US009500695B2

(12) United States Patent
Iwahashi

(10) Patent No.: US 9,500,695 B2
(45) Date of Patent: Nov. 22, 2016

(54) EXAMINATION DEVICE AND EXAMINATION METHOD

(71) Applicant: TOYOTA JIDOSHA KABUSHIKI KAISHA, Toyota-shi, Aichi-ken (JP)

(72) Inventor: Yohei Iwahashi, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 127 days.

(21) Appl. No.: 14/645,119

(22) Filed: Mar. 11, 2015

(65) Prior Publication Data

US 2015/0276848 A1 Oct. 1, 2015

(30) Foreign Application Priority Data

Mar. 28, 2014 (JP) .................................. 2014-069758

(51) Int. Cl.
*G01R 31/26* (2014.01)
(52) U.S. Cl.
CPC ........... *G01R 31/26* (2013.01); *G01R 31/2608* (2013.01); *G01R 31/2621* (2013.01); *G01R 31/261* (2013.01)
(58) Field of Classification Search
CPC .. G01R 31/26; G01R 31/28; G01R 31/2617; G01R 31/2839
See application file for complete search history.

(56) References Cited

U.S. PATENT DOCUMENTS 5,475,297 A * 12/1995 Kaneko ................. B23H 1/022
219/69.13

FOREIGN PATENT DOCUMENTS

| JP | 2007-033042 A | 2/2007 |
| JP | 2012-058050 A | 3/2012 |
| JP | 2013108802 A | 6/2013 |

* cited by examiner

*Primary Examiner* — Minh N Tang
(74) *Attorney, Agent, or Firm* — Oliff PLC

(57) ABSTRACT

An examination device disclosed herein includes: a power source; an inductor provided between the power source and the semiconductor device; a diode connected in parallel with the inductor, and having an anode connected to a negative side of the inductor and a cathode connected to a positive side of the inductor; and a current cutoff mechanism provided between the power source and the semiconductor device, and configured to cut off an inflow of current to the semiconductor device, wherein the current cutoff mechanism starts to cut off the inflow of the current to the semiconductor device before a timing at which voltage that is applied to the semiconductor device is stabilized, after having experienced a rise to surge voltage, the rise having been triggered by the semiconductor device being turned off, and the current cutoff mechanism completes the cutoff after the timing.

4 Claims, 3 Drawing Sheets

EXAMINATION DEVICE AND EXAMINATION METHOD

CROSS-REFERENCE TO RELATED APPLICATION

This application claims priority to Japanese Patent Application No. 2014-069758 filed on Mar. 28, 2014, the contents of which are hereby incorporated by reference into the present application.

TECHNICAL FIELD

A technology disclosed herein relates to an examination device for examining a semiconductor device and an examination method for examining a semiconductor device.

DESCRIPTION OF RELATED ART

Japanese Patent Application Publication No. 2013-108802 discloses an examination device including: a power source; a coil, and a cutoff unit configured to cut off an inflow of current to a semiconductor device. Upon detecting breakdown of the semiconductor device, the cutoff unit starts to cut off the inflow of the current to the semiconductor device. Upon completion of the cutoff, current no longer flows into the semiconductor device. This is intended to restrain the breakdown of the semiconductor device from progressing to cause damage to the examination device.

BRIEF SUMMARY OF INVENTION

In the examination device of Japanese Patent Application Publication No. 2013-108802, the cutoff unit starts to cut off the inflow of the current to the semiconductor device after the breakdown of the semiconductor device has been detected. Therefore, during a period from the start of the cutoff to the completion of the cutoff the current may enter the broken-down semiconductor device to cause the breakdown of the semiconductor device to progress.

This description discloses a technology that enables to apply a sufficient load to a semiconductor device and that enables to, in a case where the semiconductor device has broken down, appropriately restrain the progression of the breakdown of the semiconductor device.

This description discloses an examination device configured to examine a semiconductor device. The examination device comprises: a power source configured to generate source voltage to be applied to the semiconductor device; an inductor provided between the power source and the semiconductor device; a diode connected in parallel with the inductor, and having an anode connected to a negative side of the inductor and a cathode connected to a positive side of the inductor, and a current cutoff mechanism provided between the power source and the semiconductor device, and configured to cut off an inflow of current to the semiconductor device, wherein the current cutoff mechanism starts to cut off the inflow of the current to the semiconductor device before a timing at which voltage that is applied to the semiconductor device is stabilized, after having experienced a rise to surge voltage, the rise having been triggered by the semiconductor device being turned off, and the current cutoff mechanism completes the cutoff after the timing.

As a result of the inventor's diligent study, the inventor found that in a case where a semiconductor device is examined, a sufficient load can be applied to the semiconductor device if the current can be made to flow through the semiconductor device until the timing at which the voltage applied to the semiconductor device is stabilized, after having experienced its rise to the surge voltage, of which rise had been triggered by the semiconductor device being turned off. Further, the inventor also found that in most cases, the semiconductor device breaks down while the value of the voltage applied to the semiconductor device is still rising to the surge voltage or after the value of the voltage applied to the semiconductor device has risen to the surge voltage. In the examination device, the current cutoff mechanism starts to cut off the inflow of the current to the semiconductor device before the timing at which the voltage applied to the semiconductor device is stabilized, after having experienced its rise to the surge voltage, the rise having been triggered by the semiconductor device being turned of and the current cutoff mechanism completes the cutoff after the timing. Therefore, the examination device enables to apply a sufficient load to the semiconductor device. Even in a case where the semiconductor device breaks down, the progression of the breakdown of the semiconductor device can be appropriately restrained in comparison with the configuration in which the inflow of the current to the semiconductor device starts to be cut off after the breakdown of the semiconductor device has been detected. Therefore, the examination device enables to apply a sufficient load to the semiconductor device and to, in a case where the semiconductor device has broken down, appropriately restrain the progression of the breakdown of the semiconductor device.

Furthermore, the current cutoff mechanism may start the cutoff after a timing at which the semiconductor device starts to turn off.

This description also discloses a method configured to examine a semiconductor device. An examination device used for an examination has the same configuration as above. The method causes the current cutoff mechanism to start to cut off the inflow of the current to the semiconductor device before a timing at which voltage that is applied to the semiconductor device is stabilized, after having experienced a rise to surge voltage, the rise having been triggered by the semiconductor device being turned off, and further causes the current cutoff mechanism to complete the cutoff after the timing.

The examination method enables to apply a sufficient load to the semiconductor device and to, in a case where the semiconductor device has broken down, appropriately restrain the progression of the breakdown of the semiconductor device.

Furthermore, the method may cause the current cutoff mechanism to start the cutoff after a timing at which the semiconductor device starts to turn off.

DETAILED DESCRIPTION OF INVENTION

First Embodiment

Figure 1:
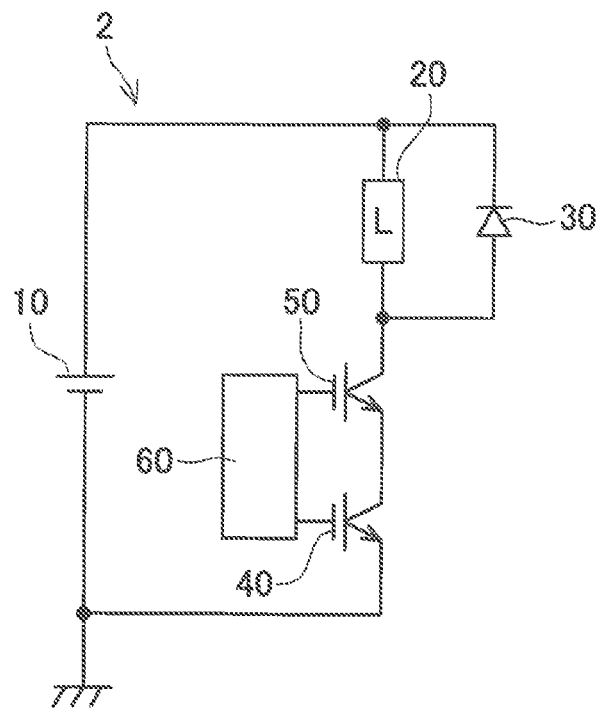
FIG. 1 is a circuit diagram showing an examination device of a first embodiment.

Configuration of Examination Device 2; FIG. 1

As shown in FIG. 1, an examination device 2 of the present embodiment is a device configured to conduct an inductive load examination on a semiconductor device (hereinafter referred to as "examination target device") 40 serving as an object to be examined. The examination device 2 comprises a power source 10, an inductor 20, a diode 30, a cutoff device 50, and a gate voltage control circuit 60. An examination target device 40 is set in the examination device 2.

The examination target device 40 is an IGBT. In a modification, the examination target device 40 may be any power device such as a MOSFET. The examination target device 40 is replaced with another examination target device 40 every time the examination is conducted. In the examination conducted using the examination device 2 of the present embodiment, the examination target device 40 is controlled by the gate voltage control circuit 60 to start to turn off at a predetermined timing to be described in detail later.

The power source 10 is configured to generate source voltage to be supplied to the examination target device 40. The source voltage is for example 600 V.

The inductor 20 is connected between the power source 10 and the cutoff device 50. The inductor 20 is used as a load for the inductive load examination.

The diode 30 is connected in parallel with the inductor 20. An anode of the diode 30 is connected to a negative side of the power source 10 and a cathode of the diode 30 is connected to a positive side of the power source 10. The diode 30 allows passage of current that is induced by the inductor 20 when the examination target device 40 is turned off.

The cutoff device 50 is connected between the inductor 20 and the examination target device 40. The cutoff device 50 is an IGBT. In a modification, the cutoff device 50 may be any other switching element. While the cutoff device 50 is in an off state, an inflow of current to the examination target device is cut off. In the examination conducted using the examination device 2 of the present embodiment, the cutoff device 50 is controlled by the gate voltage control circuit 60 to start to turn off at the predetermined timing to be described in detail later.

The gate voltage control circuit 60 controls gate voltage of the examination target device 40 and gate voltage of the cutoff device 50.

(Examination Using Examination Device 2)

Figure 2:
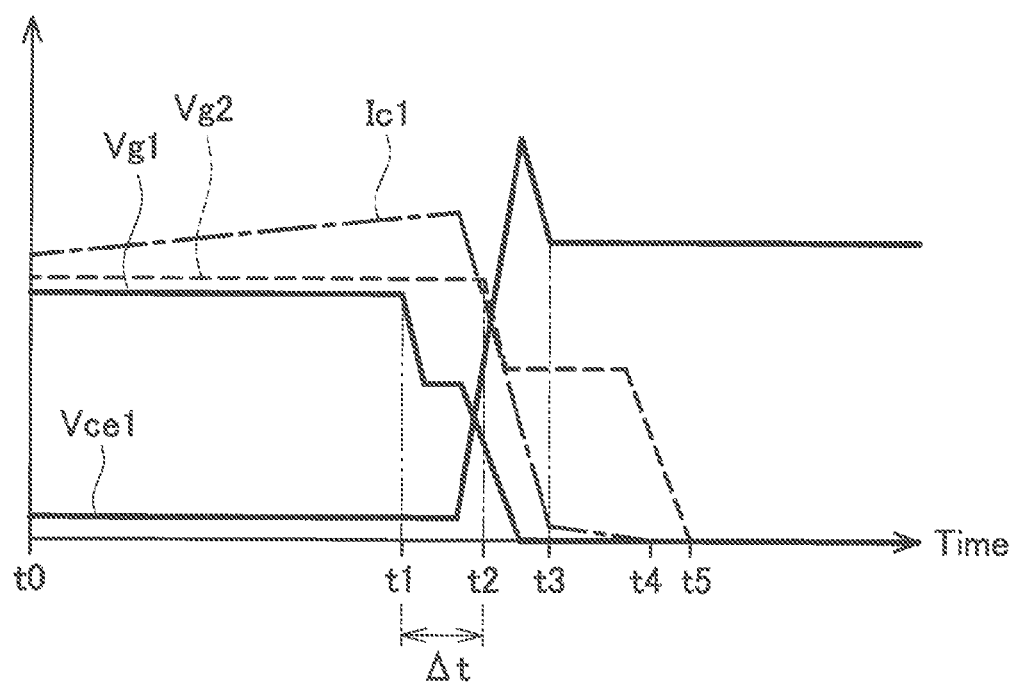
FIG. 2 is a graph showing changes in values of Vg1, Ic1, Vce1, and Vg2 in a case where an examination target device is not broken down in the first embodiment.
Figure 3:
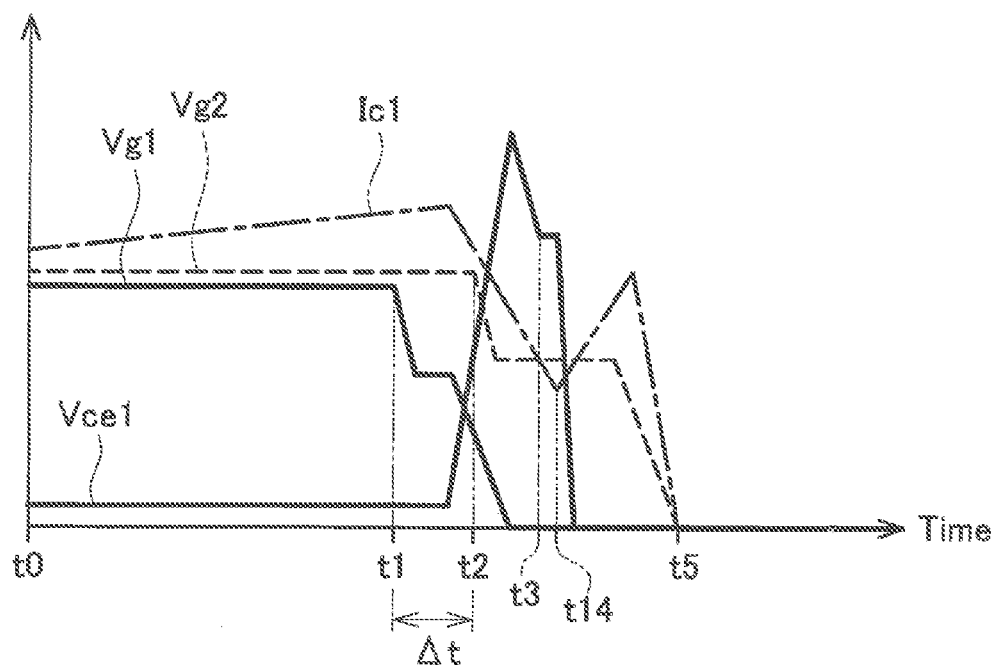
FIG. 3 is a graph showing changes in values of Vg1, Ic1, Vce1, and Vg2 in a case where the examination target device breaks down in the first embodiment.

FIG. 2 and FIG. 3 are graphs showing the values of gate voltage Vg1 that is applied to the examination target device 40, collector-emitter voltage Vce1 that is applied to the examination target device 40, current Ic1 that flows through the examination target device 40, and gate voltage Vg2 that is applied to the cutoff device 50 in a case where an examination is conducted using the examination device 2 of the present embodiment. FIG. 2 shows the values as observed in a case where the examination target device 40 is not broken down during the examination (i.e. in a case where the examination target device 40 is normal). FIG. 3 shows the values as observed in a case where the examination target device 40 breaks down during the examination (i.e. in a case where there is an abnormality in the examination target device 40).

(Case where Examination Target Device 40 is not Broken Down; FIG. 2)

An example of a case where the examination target device 40 is not broken down during the examination is described with reference to FIG. 2. At a timing t0, the examination target device 40 and the cutoff device 50 are both on. That is, the gate voltages Vg1 and Vg2 of predetermined values are applied to a gate electrode of the examination target device 40 and a gate electrode of the cutoff device 50, respectively. During this time, the voltage Vce1 that is applied to the examination target device 40 takes on a low value. Further, the current Ic1 of a predetermined value flows through the examination target device 40.

In the example shown in FIG. 2, at a timing t1 that follows, the gate voltage control circuit 60 causes the examination target device 40 to start to turn off. That is, starting from the timing t1, the gate voltage control circuit 60 causes the value of the gate voltage Vg1 of the examination target device 40 to gradually lower to become 0 when a predetermined period of time has elapsed since the examination target device 40 started to turn off.

When, at the timing t1, the examination target device 40 starts to turn off then the voltage Vce1 that is applied to the examination target device 40 starts to rise. The voltage Vce1 rises to a value that is higher than that of the source voltage (600 V). Voltage that is higher than the source voltage (600 V) is hereinafter referred to as "surge voltage". The voltage Vce1 rises to the surge voltage, and then at a timing t3 and thereafter, the voltage Vce1 is stabilized at a constant value that is close to that of the source voltage. Further, when, at the timing t1, the examination target device 40 starts to turn off the current Ic1 that flows though the examination target device 40 gradually attenuates to become substantially 0 at the timing t3 at which a predetermined period of time has elapsed since the examination target device 40 started to turn off. At the timing t3, Vg1 is 0, Vce1 is stabilized at a constant value that is close to that of the source voltage, and Ic1 is substantially 0. At a timing t4 that follows, Ic1 becomes completely 0, so that the examination target device 40 completely shifts to an off state.

In the present embodiment, at the timing t2 at which a particular period of time Δt has elapsed since the timing t1, the gate voltage control circuit 60 causes the cutoff device 50 to start to turn off (i.e. to cut off the inflow of the current to the examination target device 40). That is, starting from the timing t2, the gate voltage control circuit 60 causes the gate voltage Vg2 of the cutoff device 50 to gradually lower to become 0 at a timing t5 at which a predetermined period of time has elapsed since the cutoff device 50 started to turn off. The period of time Δt is set so that the timing t2 follows the timing t1 and precedes the timing t3. When the gate voltage Vg2 becomes 0, then the cutoff device 50 completely shifts to the off state. That is, the cutoff of the inflow of the current to the examination target device 40 is completed.

It should be noted here that in a case where the inductive load examination is conducted using the examination device 2, a sufficient load can be applied to the examination target device 40 if the current can be made to flow through the examination target device 40 until the timing t3, at which the voltage Vce1 is stabilized at a constant value, after having experienced its rise to the surge voltage, which was triggered by the turn-off of the examination target device 40. In the example shown in FIG. 2, the timing t5, at which the cutoff device 50 becomes completely off, follows the timing t3.

This enables to cause current to flow through the examination target device 40 until the timing t3. This enables to apply a sufficient load to the examination target device 40.

Therefore, use of the examination device 2 of the present embodiment enables to appropriately conduct the examination.

(Case where Examination Target Device 40 Breaks Down; FIG. 3)

An example of a case where the examination target device 40 breaks down during the examination is described with reference to FIG. 3. At a timing t0, the examination target device 40 and the cutoff device 50 are both on. That is, the gate voltages Vg1 and Vg2 of predetermined values are applied to the gate electrode of the examination target device 40 and the gate electrode of the cutoff device 50, respectively. The voltage Vce1 that is applied to the examination target device 40 takes on a low value. Further, the current Ic1 of a predetermined value flows through the examination target device 40.

Also in the example shown in FIG. 3, at a timing t1 that follows, the gate voltage control circuit 60 causes the examination target device 40 to start to turn off.

When, at the timing t1, the examination target device 40 starts to turn off the voltage Vce1 that is applied to the examination target device 40 rises to the surge voltage. After having experienced its rise to the surge voltage, the voltage Vce1 is stabilized at a constant value that is close to that of the source voltage at a timing t3 and thereafter. Further, when, at the timing t1, the examination target device 40 starts to turn off; the current Ic1 that flows through the examination target device 40 gradually attenuates.

However, in the example shown in FIG. 3, the examination target device 40 breaks down at a timing t14 at which the current Ic1 is about to become completely 0. When the examination target device 40 breaks down, the value of the current Ic1 starts to rise again. Further, the value of Vce1 becomes 0.

In the example shown in FIG. 3, as in the example shown in FIG. 2, at the timing t2 at which a particular period of time Δt has elapsed since the timing t1, the gate voltage control circuit 60 causes the cutoff device 50 to start to turn off. The timing t2 is a timing that follows the timing t1, at which the examination target device 40 starts to turn off and that precedes the timing t3, at which Vce1 is stabilized at a constant value that is close to that of the source voltage. When the cutoff device 50 starts to turn off, the value of the gate voltage Vg2 of the cutoff device 50 is gradually lowered to become 0 at a timing t5 at which a predetermined period of time has elapsed since the cutoff device 50 started to turn off. That is, the cutoff of the inflow of the current to the examination target device 40 is completed at the timing t5.

When the cutoff of the inflow of the current to the examination target device 40 is completed at the timing t5, the value of the current Ic1 that had started to rise due to the breakdown of the examination target device 40 having taken place at the timing t14 becomes 0.

Figure 4:
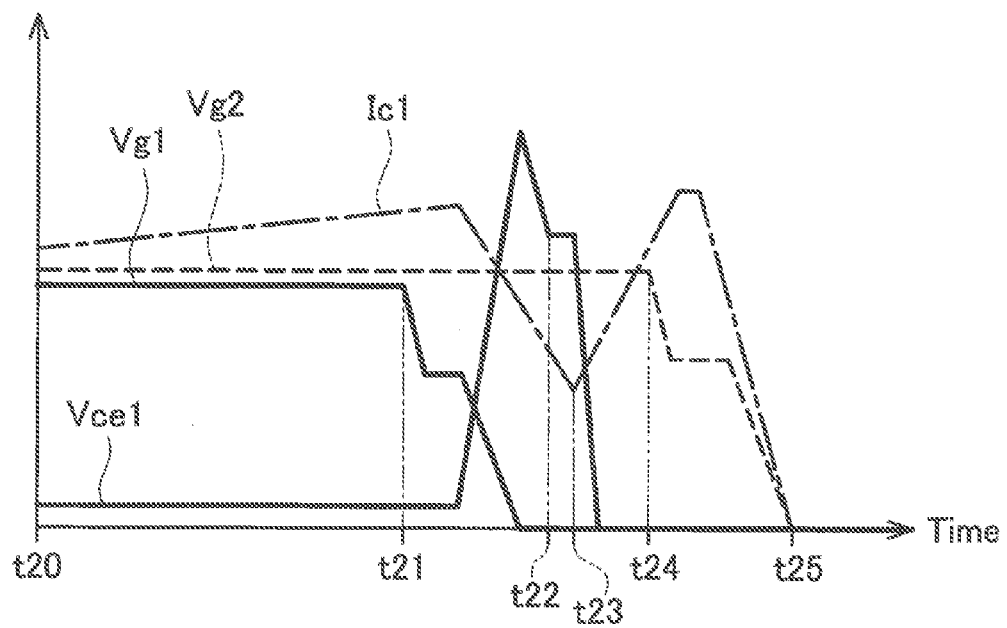
FIG. 4 is a graph showing changes in values of Vg1, Ic1, Vce1, and Vg2 in a case where an examination target device breaks down in a comparative embodiment.

(Comparative Embodiment FIG. 4)

For a sufficient explanation of the working-effect of the examination device of the present embodiment, a comparative embodiment in which an examination that is similar to that of the present embodiment is conducted using a conventional examination device is described with reference to FIG. 4. Similar to the examination device 2 shown in FIG. 1, the conventional examination device also includes a power source 10, an inductor 20, a diode 30, a cutoff device 50, and a gate voltage control circuit 60. An examination target device 40 is set in the examination device 2. However, the conventional examination device differs from the examination device of the present embodiment in that the cutoff device 50 starts to turn off after breakdown of the examination target device 40 has been detected.

As shown in FIG. 4, at a timing t20, the examination target device 40 and the cutoff device 50 are both on. Also in the example shown in FIG. 4, at a timing t21 that follows, the gate voltage control circuit 60 causes the device to examined 40 to start to turn off.

When, at the timing t21, the device to examined 40 starts to turn off the voltage Vce1 that is applied to the examination target device 40 rises to surge voltage. After having experienced its rise to the surge voltage, the voltage Vce1 is stabilized at a constant value that is close to that of the source voltage at a timing t22 and thereafter. Further, when, at the timing t22, the device to examined 40 starts to turn off; the current Ic1 that flows through the examination target device 40 gradually attenuates.

However, in the example shown in FIG. 4, the examination target device 40 breaks down at a timing t23 at which the current Ic1 is about to become completely 0. When the examination target device 40 breaks down, the value of the current Ic1 starts to rise again. Further, the value of Vce1 becomes 0.

In the comparative embodiment, at a timing t24 that follows the detection of the breakdown of the examination target device 40 at the timing 123, the gate voltage control circuit 60 causes the cutoff device 50 to start to turn off (i.e. to cut off an inflow of current to the examination target device 40). At a timing t25 that follows, the cutoff device 50 finishes turning off so that the cutoff of the inflow of the current to the examination target device 40 is completed.

When the cutoff of the inflow of the current to the examination target device 40 is completed at the timing t25, the value of the current Ic1 having started to rise due to the breakdown of the examination target device 40 having taken place at the timing t14 becomes 0.

In the comparative embodiment described above, the cutoff device 50 starts to turn off at the timing t24 that follows the detection of the breakdown of the examination target device 40 at the timing t23. Therefore, as in the example shown in FIG. 4, in a case where the examination target device 40 breaks down at the timing t23, the cutoff device 50 does not finish turning off until the timing 125 at which a certain amount of time has elapsed since the timing 123. That is, in the comparative embodiment, there is a long period of time from the timing t23 at which the examination target device 40 was broken down to the timing t25 at which the current is cut off. Further, the current Ic1 rises during the period of time from the timing t23 to the timing t25. That is, in the comparative embodiment shown in FIG. 4, a large current flows though the examination target device 40 over the long period of time after the examination target device 40 has broken down. Therefore, in the case where the examination is conducted using the conventional examination device and the examination target device 40 breaks down, the breakdown of the examination target device 40 progresses and the examination device 2 is greatly burdened.

On the other hand, as shown in FIG. 3, in the present embodiment, the cutoff device 50 starts to turn off at the timing t2 that precedes the timing t3 at which the voltage Vce1 is stabilized at the constant value that is close to that of the source voltage. Therefore, as in the example shown in FIG. 3, even in the case where the examination target device 40 breaks down at the timing t14 that immediately follows the timing t3, the cutoff device 50 finishes turning off at the timing t5 that comes comparatively soon after the timing t14. Therefore, as shown in FIG. 3, after the examination target device has broken down, only a comparatively small current flows through it only for a comparatively short period time from the timing t14 to the timing t5. Therefore, even in the case where the examination target device 40 breaks down, the breakdown of the examination target device 40 less progresses and the examination device 2 is not so much burdened.

Therefore, use of the examination device 2 of the present embodiment enables to appropriately conduct an examination while applying a sufficient load to the examination target device 40, and enables to, even in a case where the examination target device 40 has broken down during the examination, restrain the progression of the breakdown of the examination target device 40.

Correspondence between the terms used in the present embodiment and those used in the claims is explained. The examination target device 40 is an example of the "semiconductor device". The cutoff device 50 is an example of the "current cutoff mechanism". The timing t3 in FIG. 2 and FIG. 3 is an example of the "timing".

Second Embodiment

Figure 5:
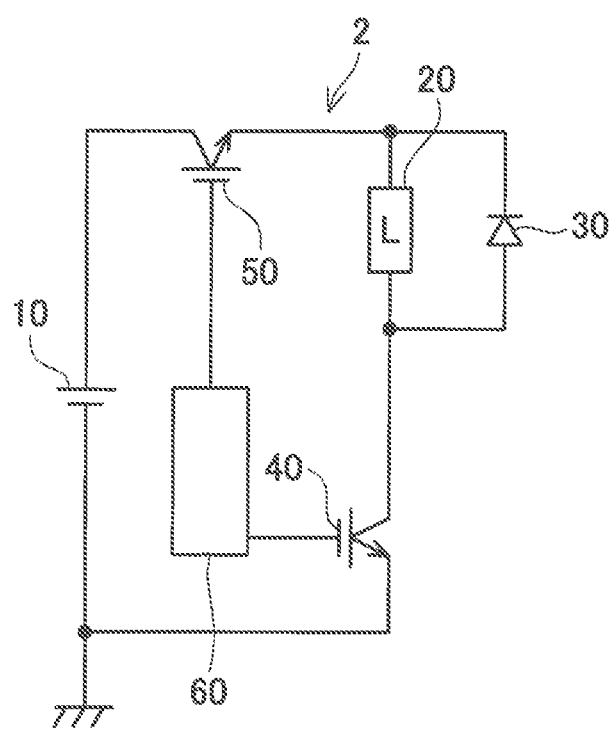
FIG. 5 is a circuit diagram showing an examination device of a second embodiment.

An examination device of a second embodiment is described with reference to FIG. 5, with emphasis on points of difference from that of the first embodiment. The examination device 2 of the present embodiment is identical to that of the first embodiment in that the examination device 2 of the present embodiment also includes a power source 10, an inductor 20, a diode 30, a cutoff device 50, and a gate voltage control circuit 60. An examination target device 40 is set in the examination device 2. The examination device 2 of the present embodiment is different from that of the first embodiment in that the cutoff device 50 is connected between the power source 10 and the inductor 20. Also in a case where an examination is conducted using the examination device 2 of the present embodiment, timings at which the examination target device 40 and the cutoff device 50 turn off are the same as those of the first embodiment (see FIG. 2 and FIG. 3). Therefore, the examination device 2 of the present embodiment can also bring about a working-effect that is similar to that of the first embodiment.

While specific examples of the technology disclosed herein have been described above in detail, these examples are merely illustrative and place no limitation on the scope of the patent claims. The technology described in the patent claims also encompasses various changes and modifications to the specific examples described above. For example, the following modifications may be adopted.

(Modification 1) In each of the embodiments described above, as shown in FIG. 2 and FIG. 3, the cutoff device 50 starts to turn off at the timing t2 that precedes the timing t3 at which Vce1 is stabilized at the constant value that is close to that of the source voltage, and the cutoff device 50 finishes tuning off at the timing t5 that comes comparatively soon after the timing t3. The timing at which the cutoff device 50 starts to turn off can be arbitrarily changed according to the turn-off characteristics of a switching element that is used in the cutoff device 50. Therefore, for example, in a case where the cutoff device 50 is a device that requires a comparatively long period of time from the point in time at which the it starts to turn off to the point in time at which it finishes turning off, the timing (timing t2 shown in FIG. 2 and FIG. 3) at which the cutoff device 50 starts to turn off may precede the timing (timing t1 shown in FIG. 2 and FIG. 3) at which the examination target device 40 starts to turn off. Also in that case, the cutoff device 50 needs only finish turning off at the timing (timing t3 shown in FIG. 2 and FIG. 3) at which the voltage Vce1 is stabilized at the constant value that is close to that of the source voltage or at a later timing.

(Modification 2) Further, the timing at which the cutoff device 50 finishes turning off may be substantially the same as the timing t3 at which the voltage Vce1 is stabilized at the constant value that is close to that of the source voltage.

Generally speaking, the current cutoff mechanism may start to cut off the inflow of the current to the semiconductor device before a timing at which voltage that is applied to the semiconductor device is stabilized after having experienced its rise to the surge voltage, which was triggered by the semiconductor device being turned off, and may complete the cutoff after the timing.

The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. An examination device configured to examine a semiconductor device, the examination device comprising:
   a power source configured to generate source voltage to be applied to the semiconductor device;
   an inductor provided between the power source and the semiconductor device;
   a diode connected in parallel with the inductor, and having an anode connected to a negative side of the inductor and a cathode connected to a positive side of the inductor, and
   a current cutoff mechanism provided between the power source and the semiconductor device, and configured to cut off an inflow of current to the semiconductor device,
   wherein the current cutoff mechanism starts to cut off the inflow of the current to the semiconductor device before a timing at which voltage that is applied to the semiconductor device is stabilized, after having experienced a rise to surge voltage, the rise having been triggered by the semiconductor device being turned off, and
   the current cutoff mechanism completes the cutoff after the timing.

2. The examination device as in claim 1, wherein the current cutoff mechanism starts the cutoff after a timing at which the semiconductor device starts to turn off.

3. A method configured to examine a semiconductor device, wherein
   an examination device used for an examination comprises:
   a power source configured to generate voltage to be applied to the semiconductor device;
   an inductor provided between the power source and the semiconductor device;
   a diode connected in parallel with the inductor, and having an anode connected to a negative side of the inductor and a cathode connected to a positive side of the inductor, and a current cutoff mechanism provided between the power source and the semiconductor device, and configured to cut off an inflow of current to the semiconductor device, the method comprises:

causing the current cutoff mechanism to start to cut off the inflow of the current to the semiconductor device before a timing at which voltage that is applied to the semiconductor device is stabilized, after having experienced a rise to surge voltage, the rise having been triggered by the semiconductor device being turned off, and causing the current cutoff mechanism to complete the cutoff after the timing.

4. The method as in claim 3, wherein the method causes the current cutoff mechanism to start the cutoff after a timing at which the semiconductor device starts to turn off.

* * * * *